United States Patent [19]

Okamoto

[11] Patent Number: 5,459,751
[45] Date of Patent: Oct. 17, 1995

[54] DEMODULATION CIRCUIT OF COMMUNICATION CONTROL SYSTEM

[75] Inventor: Yasushi Okamoto, Itami, Japan

[73] Assignee: Mitsubishi Denki Kabushiki Kaisha, Tokyo, Japan

[21] Appl. No.: 178,175

[22] Filed: Jan. 6, 1994

[30] Foreign Application Priority Data

Jan. 14, 1993 [JP] Japan .................................. 5-004925

[51] Int. Cl.⁶ ................................ H03K 7/08; H03K 9/08
[52] U.S. Cl. ................. 375/354; 370/9; 341/53; 341/178; 375/238
[58] Field of Search .................... 375/22, 106; 370/8, 370/9; 341/53, 178, 179

[56] References Cited

U.S. PATENT DOCUMENTS 4,429,384 1/1984 Kaplinsky ........................... 375/22 X
5,134,632 7/1992 Fletcher et al. ....................... 375/22
5,315,299 5/1994 Matsumoto ........................ 375/22 X

*Primary Examiner*—Stephen Chin
*Assistant Examiner*—Bryan E. Webster
*Attorney, Agent, or Firm*—Lowe, Price, LeBlanc & Becker

[57] ABSTRACT

A demodulation circuit of the communication control system is disclosed, in which the rising edge and the falling edge of a symbol or a one-bit data subjected to pulse width modulation as inputted from a transmission path are detected. The time width of a high-level section or a low-level section of the symbol or the one-bit data is measured on the basis of the result of edge detection. The time width thus measured is compared with a reference time width set in advance. According to the result of comparison, the sampling timing for the high-level section and the low-level section is adjusted respectively. The sampling timing thus adjusted is used to demodulate the data requiring demodulation including the symbol and the one-bit data.

9 Claims, 15 Drawing Sheets

Fig. 4(a) TRANSFER DATA 42 Prior Art
Fig. 4(b) Bus⁺ 36 Prior Art
Fig. 4(c) Bus⁻ 37 Prior Art
Fig. 4(d) RECEIVER OUTPUT 5 Prior Art Fig. 5(a) TRANSFER DATA 42
Prior Art Fig. 5(b) Bus+ 36
Prior Art Fig. 5(c) RECEIVER OUTPUT 5
Prior Art Fig. 5(d) SAMPLING CLOCK 25
Prior Art Fig. 8(a) DATA TO BE DEMODULATED 5

Fig. 8(b) CLOCK 6

Fig. 8(c) RISING EDGE DETECTION SIGNAL 15a

Fig. 8(d) FALLING EDGE DETECTION SIGNAL 15b

Fig. 11

Fig. 12(a) DATA TO BE DEMODULATED 5
Fig. 12(b) RISING EDGE DETECTION SIGNAL 15a
Fig. 12(c) FALLING EDGE DETECTION SIGNAL 15b
Fig. 12(d) OUTPUT SIGNAL 21 OF OR CIRCUIT 8
Fig. 12(e) CONTROL SIGNAL 23
Fig. 12(f) OUTPUT TERMINAL Q OF SR FLIP-FLOP 7
Fig. 12(g) OUTPUT TERMINAL #Q OF SR FLIP-FLOP 7
Fig. 12(h) H-LEVEL SECTION CLOCK 9a
Fig. 12(i) L-LEVEL SECTION CLOCK 10a
Fig. 12(l) SAMPLING CLOCK 25
Fig. 12(m) 3-COUNT CLOCK 29
Fig. 12(n) 6-COUNT CLOCK 30
Fig. 12(o) DEMODULATED DATA 32
Fig. 12(p) DEMODULATED SYMBOL 33
Fig. 12(q) OUTPUT OF AND CIRCUIT 500
Fig. 12(r) OUTPUT OF AND CIRCUIT 501

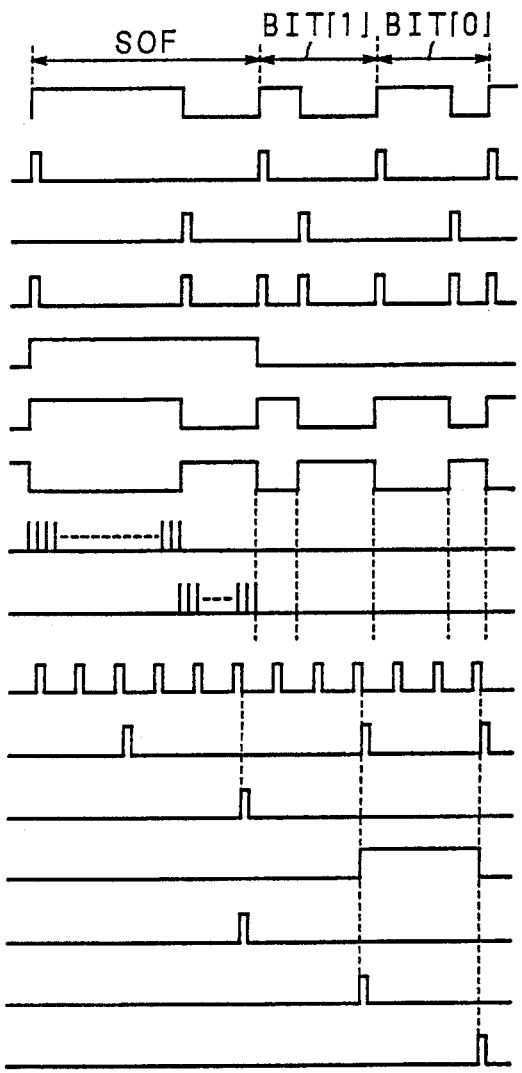

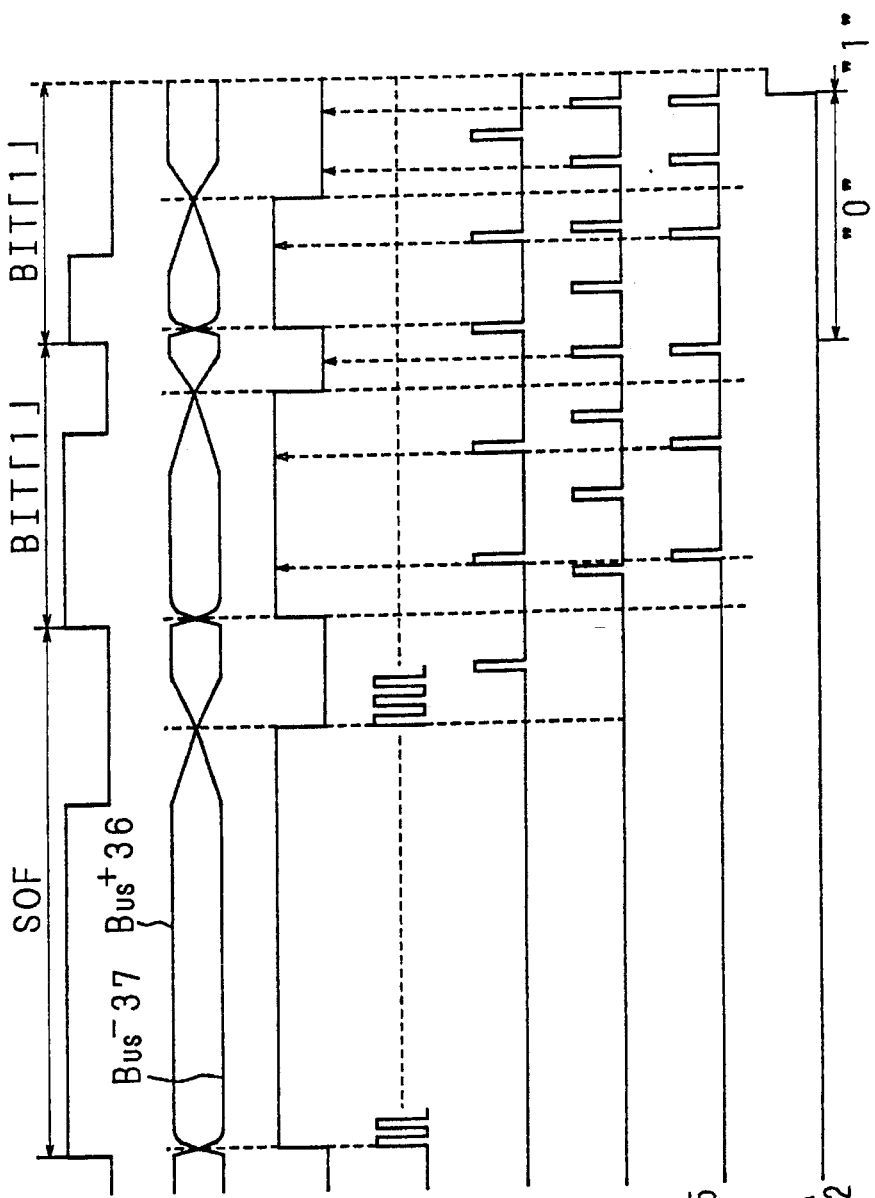

DEMODULATION CIRCUIT OF COMMUNICATION CONTROL SYSTEM

BACKGROUND OF THE INVENTION

1. Field of the Invention

The present invention relates to a demodulation circuit of a communication control system for demodulating pulse-width-modulated significant symbols and data received from a dual wire bus line.

2. Description of Related Art

FIG. 1 shows a pulse-width-modulated bit pattern defined by a PWM (Pulse Width Modulation) bit format according to Class B data communication network interface J1850 for example. The region of one bit of the data transferred on the dual wire bus line is comprised of three segmented areas (hereinafter referred to as "time"). Bit 0, as shown in FIG. 1(a), is expressed by H level at the first time 63 and second time 64, and by L level at the third time 65. Bit 1, on the other hand, is given by H level at the first time 63 and by L level at the second time 64 and third time 65 as shown in FIG. 1(b).

The symbol SOF (Start of Frame) indicating a transmission start, as shown in FIG. 1(c), is expressed by a total of 6 times as a pattern having the first, second, third and fourth times 63 to 66 at H level, and fifth and sixth times 67 and 68 at L level. The symbol EOD (End of Data) meaning the end of transmission, as shown in FIG. 1(d), is expressed by three times including the first, second and third times 63, 64 and 65 all at L level. Further, the symbol EOF (End of Frame) indicating the end of a message frame is expressed by 6 times indicating the first, second, third, fourth, fifth and sixth times 63, 64, 65, 66, 67 and 68 all at L levels.

The PWM symbols and the PWM data thus subjected to pulse width modulation are transmitted and received in a message frame format of SAE.J1850, for example, as shown in FIG. 2. Assume that a transmission frame is sent out. First, the transmission start symbol SOF is sent out, followed by the data 43 providing a PWM data of bit 0 or 1, and then the transmission end symbol EOD indicating the end of transmission. In the case where no error is detected in the symbol and data thus transmitted, the receiving party pulse-width modulates and returns a specific address assigned him as an IFR (In Frame Response). An end of frame signal EOF indicating the end of one message frame is sent out, thereby terminating one message frame.

Now, a method for demodulating the PWM symbols and the PWM data shown in FIG. 1 at the receiving end is explained. The bit 0 and bit 1 providing the PWM data shown in FIGS. 1(a) and 1(b) are comprised of three times. The data is sampled at predetermined sampling points $t_1$, $t_2$ and $t_3$ at the times 63, 64 and 65, and assuming that the first time 63 is at H level, the second time 64 at H level and the third time 65 at L level, the bit 0 is obtained as a demodulation data. With regard to the bit 1, a similar sampling operation is performed at sampling points $t_1$, $t_2$ and $t_3$, so that in the case where the first time 63 is at H level, the second time 64 at L level and the third time 65 at L level, a bit 1 is obtained as a demodulation data.

Now, explanation will be made about the demodulation of the PWM data and the PWM symbol at the receiving end. As shown in FIGS. 1(a) and 1(b), a one-bit width covers 24 clocks, and each time region 63, 64 or 65 is comprised of 8 clocks. The first sampling point $t_1$ is at the fourth clock from the data rise point, the second sampling point $t_2$ at the 12th clock, and the third sampling point $t_3$ at the 20th clock, each sampling being performed at the center of a time region.

This is also the case with the transmission start symbol SOF, the transmission end symbol EOD and the frame end symbol EOF. The transmission start symbol SOF and the frame end symbol EOF is comprised of 6 times, with 48 clocks over the PWM symbol width. As shown at the sampling points $t_1$, $t_2$, ..., $t_6$, the first, second, ..., sixth sampling points $t_1$, $t_2$, ..., $t_6$ are set to the fourth, 12th, 20th, 28th, 36th and 44th clocks respectively from the rise point of the PWM symbol, and a demodulation data is obtained by sampling at the center of each one-time region. With regard to the transmission end symbol EOD, on the other hand, like the bits 0 and 1 shown in FIGS. 1(a) and 1(b), a demodulation data is obtained by sampling at the center of the one time region of the sampling points $t_1$, $t_2$ and $t_3$.

The dual wire bus line has a stray capacitance. In the case where a transfer data with a PWM symbol and a PWM data is sent out on a dual wire bus line, therefore, the potential change of the dual wire bus line is dulled by the stray capacitance, the pull-up resistance and the pull-down resistance, whereby the H and L levels of the PWM symbol and the PWM data undergo a change. As a consequence, the center of each time region of the PWM symbol and the PWM data may fail to coincide with a sampling point, in which case the sampled demodulation data is likely to be inaccurate. For obviating this problem, the current practice is to send out a transfer data including a PWM symbol and PWM data to the dual wire bus line by means of a driver using a transistor of a large driving ability.

FIG. 3 is a block diagram showing a configuration of the receiver and the driver for connecting the communication control system with the dual wire bus line. A transfer data 42 providing the pulse-width-modulated PWM data, for example, from the communication control system not shown is applied through an inverter 40 to the gate of a P-channel MOS transistor 38 on the one hand and directly to the gate of an N-channel MOS transistor 39 on the other. The drain of the transistors 38, 39 is connected to a non-inverted dual wire bus line (hereinafter referred to as Bus$^+$) 36 and an inverted dual wire bus line (hereinafter referred to as Bus$^-$) 37. The source of the transistor 38 is connected to a power supply V, and the source of the transistor 39 grounded. The Bus$^+$side is grounded through a pull-down resistor 69, and the Bus side connected to the power supply V through a pull-up resistor 70. A receiver 41, on the other hand, includes a comparator for differential operation, with the positive input terminal+connected to the Bus$^+$36 and the negative input terminal to the Bus 37. The data 5 to be demodulated which is an output of the receiver 41 is applied to the communication control system not shown. The Bus$^+$36 holds a stray capacitance 71 and the Bus$^-$37 a stray capacitance 72.

Now, the operation of the driver and the receiver will be explained with reference to the timing chart for signals at various parts in FIGS. 4(a) to 4(d). The transfer data 42 to be sent out to the Bus$^+$36 and Bus$^-$37 from the communication control system are applied to the gates of the transistors 38, 39 providing drivers. When the transfer data is inverted from L to H level as shown in FIG. 4(a), the transistor 38 turns on and the Bus$^+$36 is raised to the potential of H level as shown in FIG. 4(b). In the process, a delay time 36ta depends on the driving ability of the transistor 38. Then, in the case where the transfer data is inverted from H to L level as shown in FIG. 4(a), the transistor 38 turns off and the Bus$^+$36 becomes the potential at L level as shown in FIG. 4(b). In the process, a delay time 36tb is determined by the values of the pull-down resistor 69 and the stray capacitance 71. The larger the stray capacitance 71, the longer the delay time 36tb.

Also, the transistor 39 turns on when the transfer data 42 is inverted from L to H level as shown in FIG. 4(a), and the Bus⁻37 assumes the potential of L level as shown in FIG. 4(c). In the process, the delay time 37ta is dependent on the driving ability of the transistor 39. Then, assuming that the transfer data 42 is inverted from H to L level as shown in FIG. 4a, the transistor 39 turns off and the Bus⁻37 becomes the potential of H level as shown in FIG. 4(c). In the process, the delay time 37tb is determined by the values of the pull-up resistor 70 and the stray capacitance 72. The potentials of the Bus⁺36 and Bus⁻37 thus changed are applied to the receiver 41, and the data 5 to be demodulated which provides an output of the receiver making up a comparator for differential operation, as shown in FIG. 4d, is inverted when the Bus⁺36 and the Bus⁻37 reach a predetermined potential, which output is applied to a demodulation circuit in the communication control system.

Now, the operation for demodulating the output of the receiver 41 is explained. Assume that the transfer data 42 is sent as the transmission start symbol SOF, the bits 0 and 1 in that order as shown in FIG. 5(a). When the transfer data 42 is applied to the transistors 38, 39 constituting drivers, the potential at the Bus⁺36 is changed as shown in FIG. 5(b) under the influence of the stray capacitances 71, 72 and the resistors 69, 70 as described above, while the potential at the Bus⁻37 assumes an opposite level. The data 5 to be demodulated which is produced from the comparator providing the receiver 41 is inverted at a timing shown in FIG. 5(c) and is applied to the demodulation circuit (not shown). As a result, as shown in FIG. 5(d), the transmission start symbol SOF samples the data 5 to be demodulated, at the sampling points $t_1, t_2, \ldots, t_6$ within its region, the bit 0 at the sampling points $t_1, t_2$ and $t_3$ within its region, and the bit 1 at the sampling points $t_1, t_2, t_3$ within its region, respectively.

In the case where the transmission start symbol SOF, the bit 0 and the bit 1 applied to the demodulation circuit are demodulated at the sampling points due to the sampling clock as shown in FIG. 5(d), as described above, the potential change of the dual wire bus line is dulled under the influence of the stray capacitance, the pull-down resistance and the pull-up resistance of the dual wire bus line. When the width of the H-level section of the bits 0 and 1 and the transmission start symbol SOF applied to the demodulation circuit is more than a predetermined value, therefore, as shown in FIG. 5(d), the sampling point $t_5$ in the transmission start symbol SOF section, the sampling point $t_3$ in the bit 0 section and the sampling point $t_2$ in the bit 1 section are different from the transmission start symbol SOF, the bit 0 and bit 1 sent out to the dual wire bus line. The resulting problem is that the demodulated PWM symbol and the PWM data, even with a driver having a large driving ability, is likely to be undetermined.

In the above-mentioned prior art, the driver consists of the P-channel MOS transistors and the N-channel MOS transistors. However, in the case where the drive consists of bipolar transistors, the same problems occur.

SUMMARY OF THE INVENTION

A primary object of the invention is to provide a demodulation circuit of the communication control system which is high in the reliability of the demodulated data and is capable of establishing the PWM symbol and the PWM data to be demodulated without being affected by the stray capacitance, the pull-down resistance and the pull-up resistance of the bus line.

Another object of the invention is to provide a demodulation circuit of the communication control system which is capable of producing a highly-reliable demodulated data even from the to-be-demodulated data with the level change dulled under the influence of the stray capacitance, the pull-down resistance and the pull-up resistance of the bus line.

According to one aspect of the invention, there is provided a demodulation circuit of the communication control system having means for detecting the leading edge and the trailing edge of a bit or the symbol of the data to be demodulated, means for measuring the time width of the H-level section or the time width of the L-level section, means for comparing the measured time width of the H-level section or the L-level section with a reference time width of the H-level section or a reference time width of the L-level section as predetermined, means for adjusting the sampling timing of the H-level section and the sampling timing of the L-level section in accordance with the result of comparison, and means for demodulating the data to be modulated by sampling the same at the adjusted timing.

According to another aspect of the invention, there is provided a demodulation circuit having means for detecting the leading edge and the trailing edge of the data or the symbol to be demodulated and measuring the H-level section or the L-level section, means for comparing the time width of the H and L levels of the data to be transmitted and a predetermined symbol with the time width of the H and L levels of the data to be transmitted and the measured symbol, and means for adjusting the sampling timing for the H-level section and the sampling timing for- the L-level section in accordance with the result of comparison, thereby establishing the demodulated data in spite of the change in the time width of the H and L levels of the data to be demodulated.

The above and further objects and features of the invention will more fully be apparent from the following detailed description with the accompanying drawings.

BRIEF DESCRIPTION OF THE DRAWINGS

FIG. 11 is a block diagram showing a configuration of H-level side of the sampling clock adjusting unit in FIG. 6.

FIGS. 12(a) to 12(r) are timing charts for signals at various parts of the demodulation unit in FIG. 6.

FIGS. 15(a) to 15(h) are timing charts for various signals in demodulating the transfer data at the demodulation unit.

DESCRIPTION OF THE PREFERRED EMBODIMENTS

The invention will be explained in detail with reference to the accompanying drawings showing an embodiment.

Figure 6:
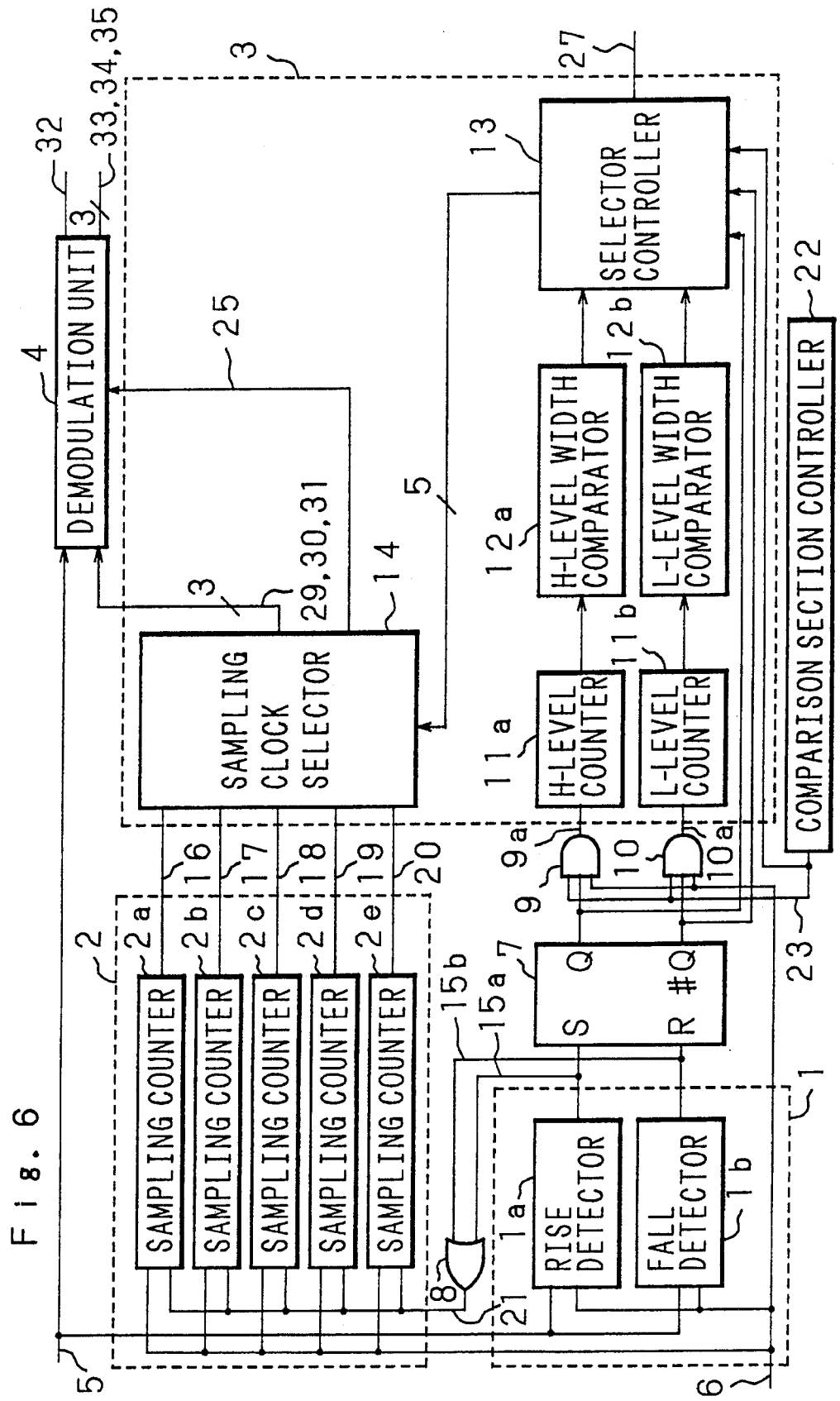
FIG. 6 is a block diagram showing a configuration of a demodulation circuit for the communication control system according to the invention.

FIG. 6 is a block diagram showing the configuration of a demodulation circuit of the communication control system according to the invention. Data 5 to be demodulated is applied to a demodulation 4 and a rise detector 1a and a fall detector 1b of an edge detector 1. A clock 6 providing a reference clock is applied to the clock terminals of sampling counters 2a, 2b, 2c, 2d, 2e making up 6-base, 7-base, octal, 9-base anti decimal counters respectively of a counter 2, a rise detector 1a, a fall detector 1b and the first input terminals of three-input AND circuits 9, 10. A rise detection signal 15a of the rise detector 1a is applied to an input terminal of an OR circuit 8 and a set terminal S of an SR flip-flop 7. A fail detection signal 15b of the fall detector 1b is applied to the other input terminal of the OR circuit 8 and a reset terminal R of the SR flip-flop 7. The output signal at an output terminal Q of the SR flip-flop 7 is applied to the second input terminal of the three-input AND circuit, 9 and the selector controller 13.

The output signal 21 of the OR circuit 8 is applied to the control terminals of the sampling counters 2a, 2b, 2c, 2d and 2e. The output signal at an output terminal #Q of the SR flip-flop 7 is applied to the second input terminal of the three-input AND circuit 10 and the selector controller 13. A comparison section control signal 23 of the comparison section controller 22 is applied to the third input terminals of the three-input AND circuits 9, 10 and the selector controller 13. A H-level section clock 9a produced from the three-input AND circuit 9 is applied to an H-level counter 11a, and a L-level section clock 10a produced from the three-input AND circuit 10 to an L-level counter 11b. The output signal of the H-level counter 11a is applied an H-level width comparator 12a and the output signal of the L-level counter 11b to an L-level width comparator 12b.

The output signals of the H-level width comparator 12a and the L-level width comparator 12b are applied to the selector controller 13. The selection signal produced from the selector controller 13 is supplied to the selection signal terminal of the sampling clock selector 14. An error signal 27 is produced from the selector controller 13. Count outputs 16, 17, 18, 19 and 20 of the sampling counters 2a, 2b, 2c, 2d and 2e are applied to the input terminal of the sampling clock selector 14. A 3-count clock 29, a 6-count clock 30, a 9-count clock 31 and a sampling clock 25 produced from the sampling clock selector 14 are applied to the demodulation unit 4. Demodulated PWM data 32 and PWM symbols 33, 34, 35 are produced from the demodulation unit 4. The H-level counter 11a, the L-level counter 11b, the H-level width comparator 12a, the L-level width comparator 12b, the selector controller 13 and the sampling clock selector 14 constitute a sampling clock adjusting unit 3.

Figure 7:
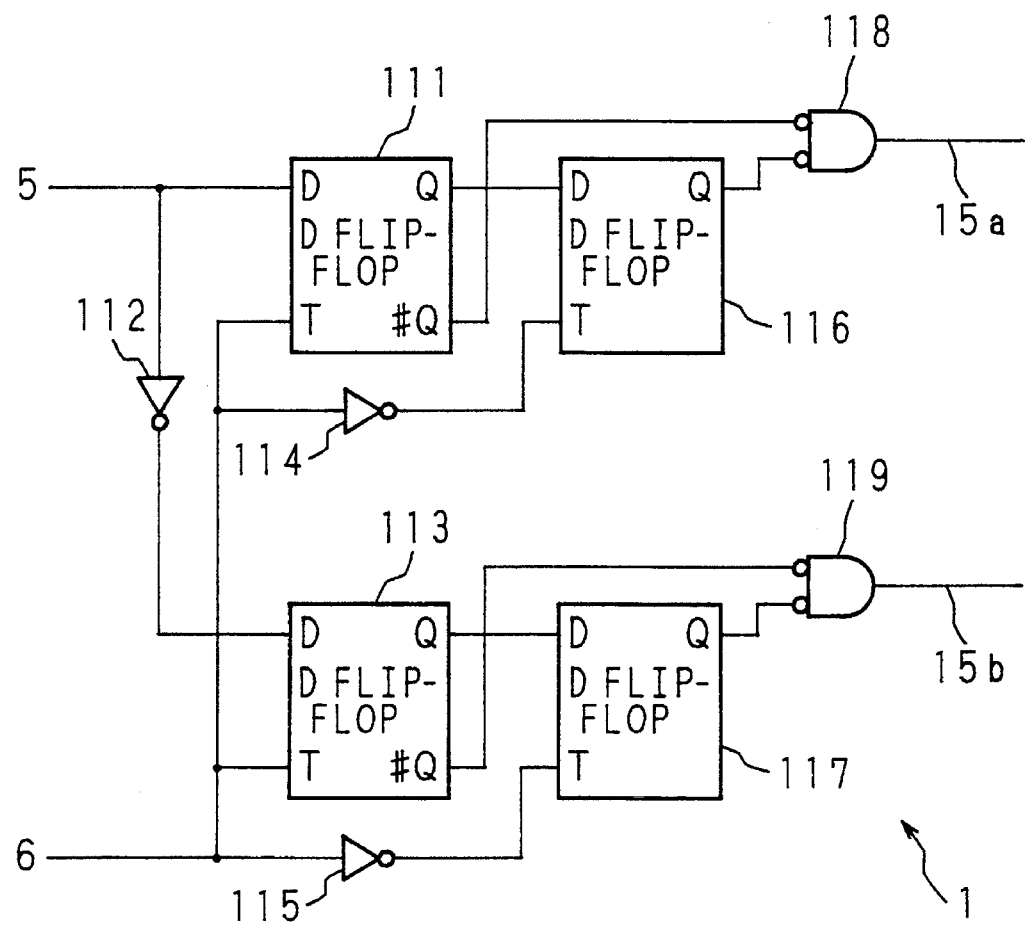
FIG. 7 is a block diagram showing a configuration of an edge detector including a rise detector and a fall detector in FIG. 6.

FIG. 7 is a block diagram showing the configuration of the edge detector 1. Data 5 to be demodulated is applied to an input terminal D of a D flip-flop 111 on the one hand and through an inverter 112 to the input terminal D of a D flip-flop 113 on the other. A clock 6, on the other hand, is applied to clock terminals T of the D flip-flops 111, 113 and to a clock terminal T (T) of a D flip-flop 116 (117) through an inverter 114 (115) at, the same time. An output signal at the output terminal Q of the D flip-flop 111 (113) is applied to the input terminal D of the D flip-flop 116 (117). An output signal at the output terminal #Q of the D flip-flop 111 (113) is applied to an input terminal of the AND circuit 118 (119). An output signal at the output terminal Q of the D flip-flop 116 (117) is applied to the other input terminal of the AND circuit 118 (119). A rising edge detection signal 15a is produced from the AND circuit 118, and a falling edge detection signal 15b from the AND circuit 119.

Figure 8:
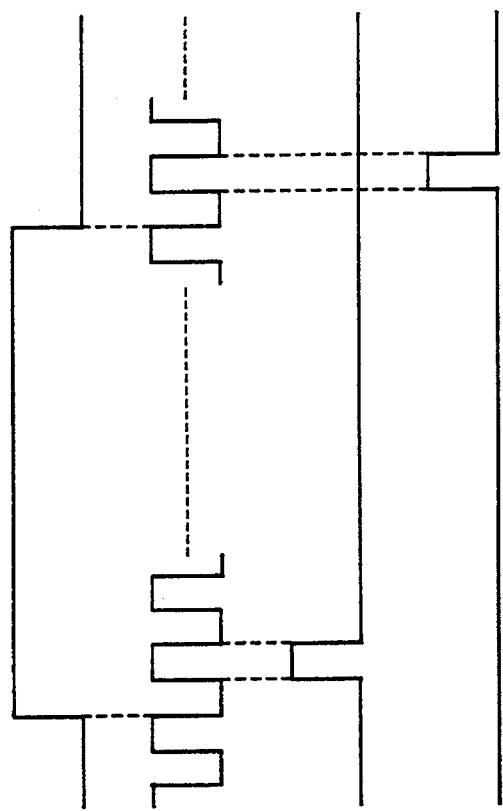
FIGS. 8(a) to 8(d) are timing charts showing the manner in which the rising and falling edges of the transfer data are detected at the edge detector.

FIGS. 8(a) to 8(d) are timing charts for signals at various parts of the edge detector 1. The operation of the edge detector 1 will be explained with reference to FIG. 8. When the data 5 to be demodulated shown in FIG. 8(a) and the clock 6 shown in FIG. 8(b) are applied to the edge detector 1, a rising edge detection signal 15a in synchronism with the rise of the data to be demodulated is produced from the AND circuit 118 as shown in FIGS. 8(c) and 8(d), and a falling edge detection signal 15b in synchronism with the fall from the AND circuit 119. These rising and falling edge detection signals 15a, 15b are applied to the OR circuit 8 (See FIG. 6), the output signal 21 of which is applied to the counter 2 as an edge detection signal.

Figure 9:
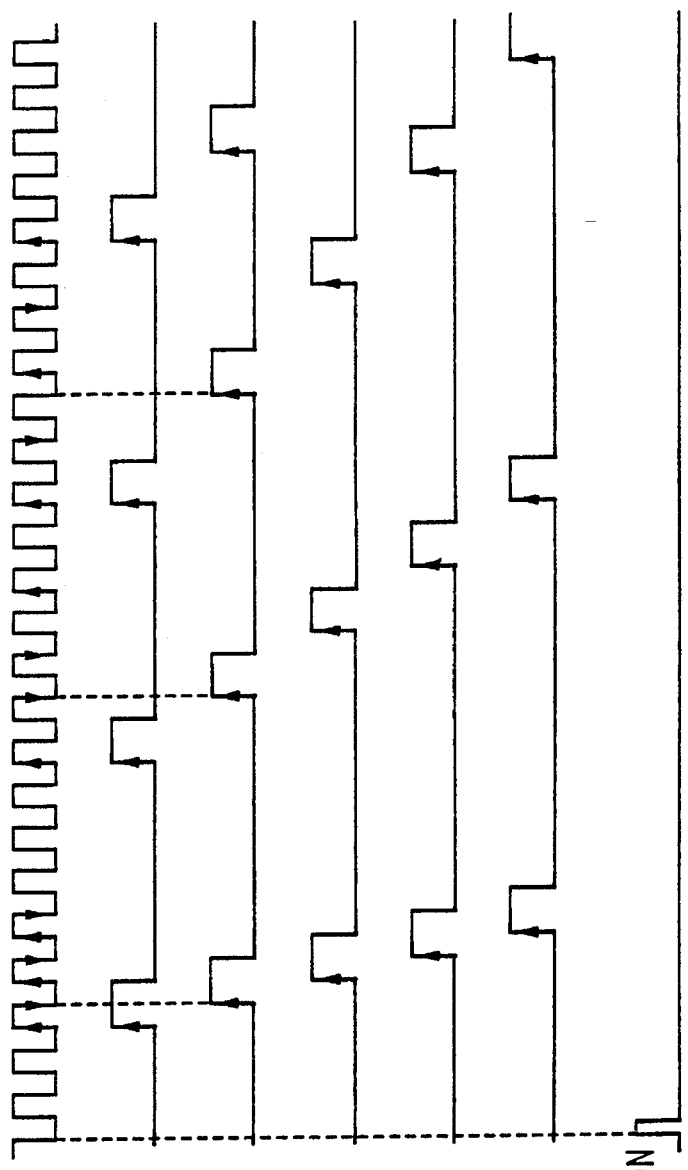
FIGS. 9(a) to 9(g) are timing charts for signals at various parts of a sampling counter in FIG. 6.

A timing chart for signals at various parts of the counter 2 is shown in FIG. 9, with reference to which the operation of the counter 2 will be described. The sampling counter 2a is a 6-base counter for counting the rise points of the clock 6 shown in FIG. 9(a), and produces a count output 16 shown in FIG. 9(b) each time six clocks are counted. The sampling counter 2b is a 7-base counter, which counts the fall points of the clock 6 and produces a count output 17 shown in FIG. 9(c) each time seven clocks are counted. The sampling counter 2c is an octal counter, which counts the rise points of the clock 6 to produce a count output 18 shown in FIG. 9(d) each time eight clock are counted. The sampling counter 2d is a 9-base counter which counts the fall points of the clock 6 and produces a count output 19 shown in FIG. 9(e) each time nine clocks are counted. The sampling counter 2e is a decimal counter which counts the rise points of the clock 6 and produces a count output 20 as shown in FIG. 9(f) each time ten clocks are counted.

The sampling counters 2a, 2b, 2c, 2d and 2e are initialized by the edge detection output 21 shown in FIG. 9(g), and the sampling counters 2a, 2b, 2c, 2d and 2e begin to count after the initial value thereof is set to the number of clocks (3, 4, 4, 5, 5). The count outputs 16, 17, 18, 19 and 20 of the sampling counters 2a, 2b, 2c, 2d and 2e are applied to the sampling clock select or 14 of the sampling adjusting unit 3.

Figure 10:
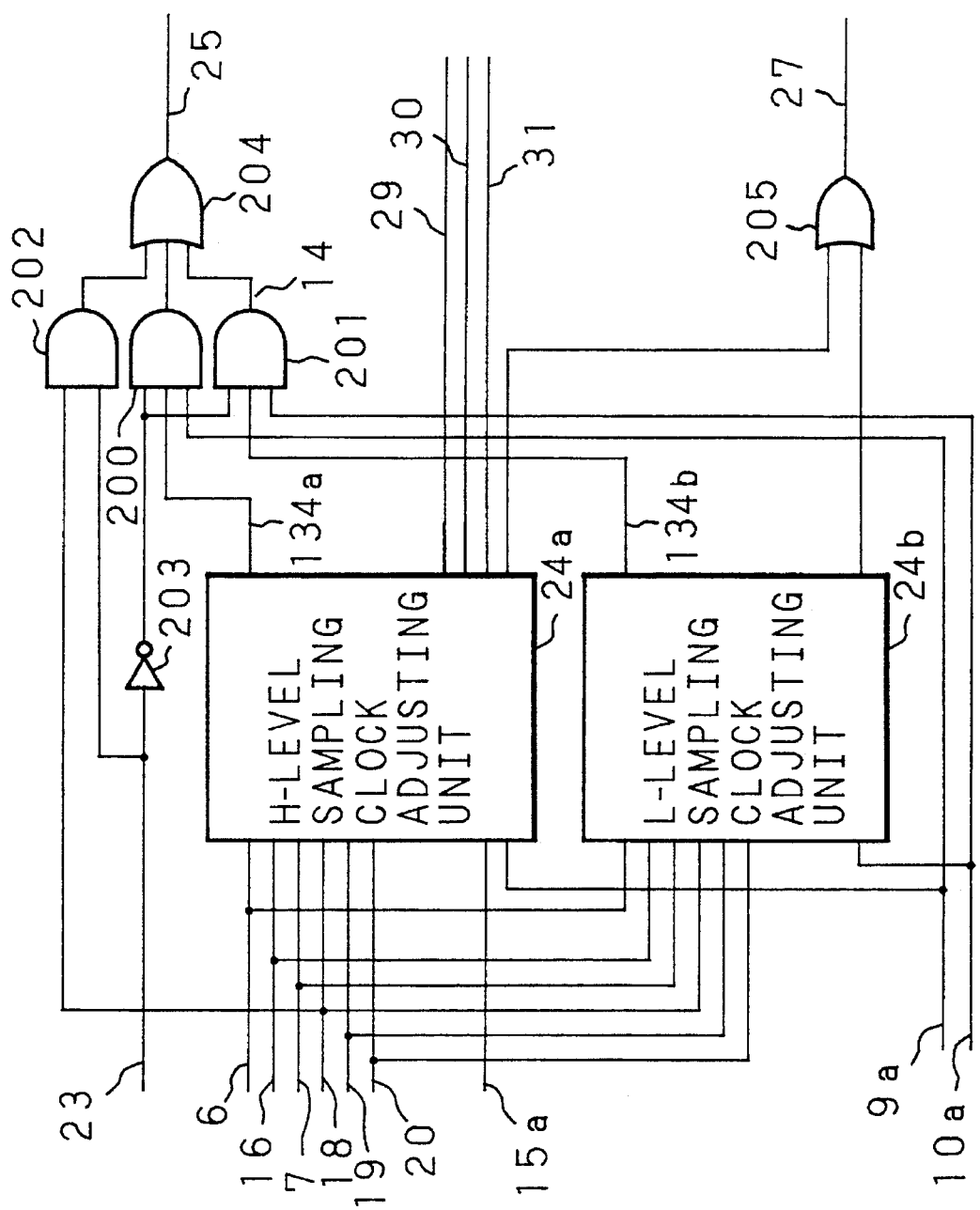
FIG. 10 is a block diagram showing a configuration of a sampling clock adjusting unit in FIG. 6.

FIG. 10 is a block diagram showing a specific configuration of the sampling clock adjusting unit 3. The sampling clock adjusting unit 3 includes an H-level sampling clock adjusting unit 24a, an L-level sampling clock adjusting unit 24b and the sampling clock selector 14. The H-level sampling clock adjusting unit 24a in turn includes the H-level counter 11a (See FIG. 6), the H-level width comparator 12a and the H-level side of the selector controller 13, and the L-level sampling clock adjusting unit 24b includes an L-level counter 11b, an L-level width comparator 12b and the L-level side of the selector controller 13.

The clock 6, the count outputs 16, 17, 18, 19, 20 of the sampling counters 2a, 2b, 2c, 2d, 2e and the rising edge detection signal 15a and the H-level section clock 9a are applied to the H-level sampling clock adjusting unit 24a. Also, the clock 6, the count outputs 16, 17, 18, 19, 20 and the L-level section clock 10a are applied to the L-level sampling clock adjusting unit 24b. The H-level section clock signal 9a is applied to the first input terminal of a three-input AND circuit 200 of the sampling clock selector 14, and the L-level section clock signal 10a to the first input terminal of a three-input AND circuit 201. The second input terminal of the three-input AND circuit 200 is supplied with an output signal 134a of the H-level sampling clock adjusting unit 24a, and the second input terminal of the three-input AND circuit 201 with an output signal 134b of the L-level sampling clock adjusting unit 24b.

The H-level sampling clock adjusting unit 24a produces a three-count, clock 29, a six-count clock 30 and a nine-count clock 31. The comparison section control signal 23 of the comparison section controller 22 is applied to an AND circuit 202 of an input terminal of the sampling clock selector 14 on the one hand and to the third input terminal of the three-input AND circuits 200, 201 through an inverter 203. The other input terminal of the AND circuit 202 is supplied with the count output 18 of the sampling counter 2c. The output of the three-input AND circuits 200, 201 and the AND circuit 202 is applied to an OR circuit 204 which in turn produces the sampling clock 25. The error signal produced from the H-level (L-level) sampling clock adjusting unit 24a (24b) is applied to the input terminals of an OR circuit 205 separately, and an error signal 27 is produced from the OR circuit 205.

Figure 11:
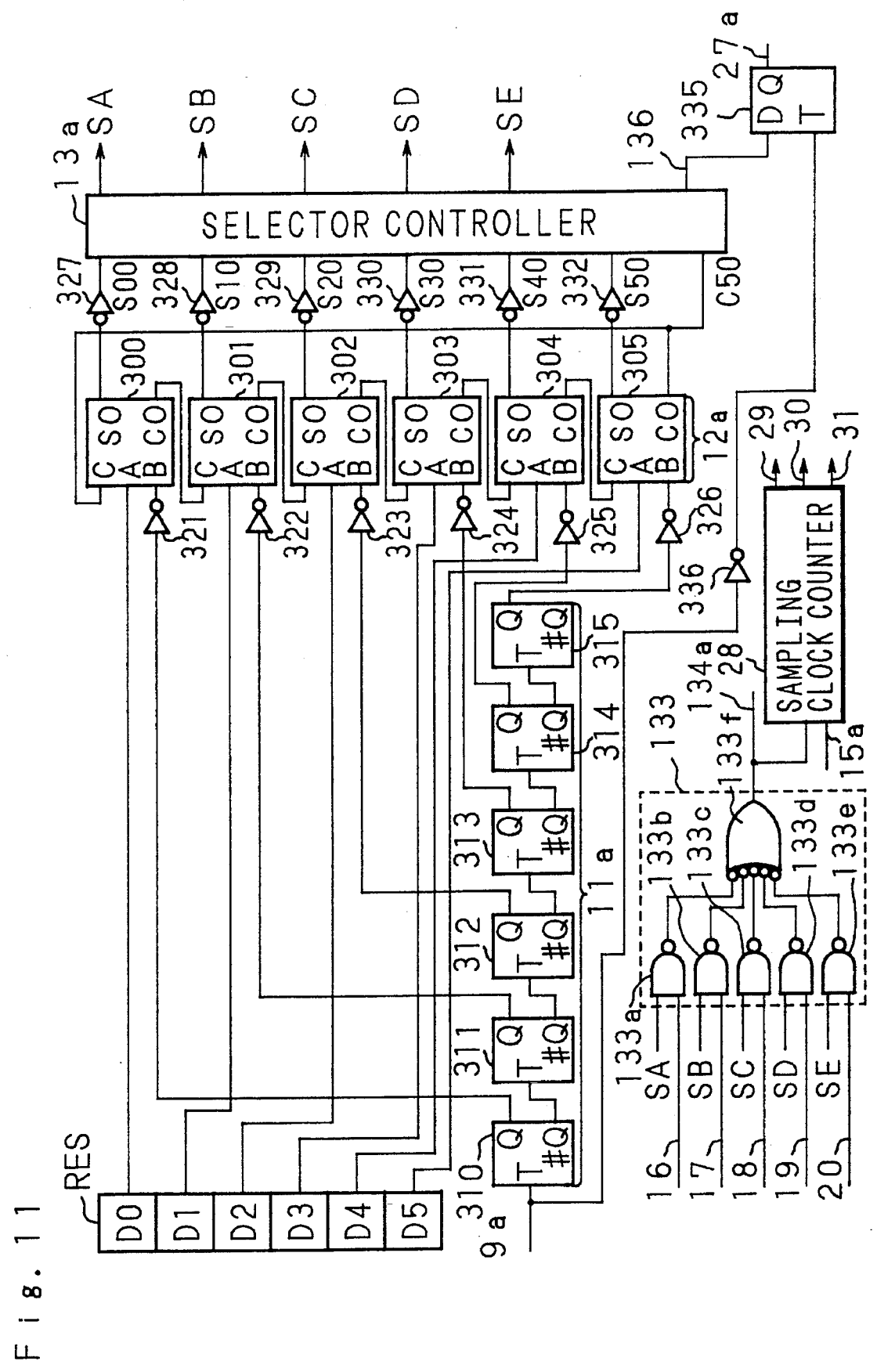

FIG. 11 is a block diagram showing a configuration of the H-level sampling clock adjusting unit. 24a. A register RES has stored therein the number of clocks D0, D1, D2, D3, D4, D5 corresponding to the data having a predetermined time width of the H-level section on the communication system. These time width data D0, D1 , D2, D3, D4, D5 are applied to input terminals A of the full-adders 300, 301 , 302, 303, 304, 305 making up the H-level width comparator 12a. The H-level section clock 9a is applied to the clock terminal T of a T flip-flop 310 in the first stage of the T flip-flops 310, 311, 312, 313, 314, 315 making up the H-level counter 11a. The output signal at the output terminal Q of the T flip-flops 310, 311, 312, 313, 314, 315 is applied to an input terminal B of the full-adders 300, 301, 302, 303, 304, 305 through inverters 321, 322, 323, 324, 325, 326 respectively.

The output signal at a sum terminal SO of the full-adders 300, 301, 302, 303, 304, 305 is applied to the selector controller 13a through inverters 327, 328, 329, 330, 331, 332 separately. A carry output signal C50 produced from a carry output terminal CO of the full-adder 305 is applied to the selector controller 13a and a carry-in terminal C of the full-adder 300. The carry output signal at the carry-out terminal CO of the full-adders 300, 301, 302, 303, 304 is applied to the carry-in terminal C of the full-adders 301, 302, 303, 304, 305 respectively. The selector controller 13a produces selection signals SA, SB, SC, SD and an error output 136. The error output 136 is applied to an input terminal D of a D flip-flop 335, a clock terminal T of which is supplied with an H-level section clock 9a through an inverter 336. An error signal 27a for the H-level section is produced from the output terminal Q of the D flip-flop 335.

The count outputs 16, 17, 18, 19 from the sampling counters 2a, 2b, 2c, 2d, 2e (See FIG. 6) are applied to an input terminal of NAND circuits 133a, 133b, 133c, 133d, 133e of a sampling selector 133, and the other input thereof is supplied with the selection signals SA, SB, SC, SD, SE. The output signal of the NAND circuits 133a, 133b, 133c, 133d, 133e is applied to each input terminal of a five-input OR circuit 133f, which in turn produces a sampling clock 134a for the H-level section. This sampling clock 134a and the rising edge detection signal 15a are applied to a sampling clock counter 28. The sampling clock counter 28 produces a sampling clock 29 each time three sampling clocks 134a are counted, a sampling clock 30 each time six sampling clocks 134a are counted, and a sampling clock 31 each time nine sampling clocks 134a are counted.

The H-level sampling clock adjusting unit 24a will be described more in detail.

The register RES stores a time width data for the H-level section. In the case under consideration, the H-level time width of the transmission start symbol SOF providing the First PWM symbol of tile message frame is set to, say, 32 clocks [0, 1, 0, 0, 0, 0 <B>](<B> indicates the binary notation). On the basis of the detection of the H-level time width of the transmission start symbol SOF, the H-level sampling point of subsequent PWM data of bit 0 and bit 1 are regulated.

In FIG. 6, as described above, the rising edge detection signal 15a and the falling edge detection signal 15b from the edge detector 1 are applied to the SR flip-flop 7, the output of which, together with the comparison section control signal 23 from the comparison section controller 22 and the clock 6, is applied to and through the AND circuit 9 thereby to produce an H-level section clock 9a to be applied to the H-level counter 11a in FIG. 11.

Explanation will further be made with reference to the timing charts for signal at, various parts in FIGS. 12a to 12(r).

FIG. 12(a) shows a waveform of the data 5 to be demodulated including the PWM symbol and the PWM data. The rising edge detection signal 15a, as shown in FIG. 12(b), is detected and produced as a leading edge of the data 5 to be demodulated at the edge detector 1. The falling edge detection signal 15(b), on the other hand, is detected and produced as a trailing edge of the data 5 to be demodulated as shown in FIG. 12(c). This signal is applied to the SR flip-flop 7 shown in FIG. 6, and the signal at the output terminal Q of the SR flip-flop 7, as shown in FIG. 12(f), becomes H upon detection of a rising edge, and L upon detection of a falling edge.

The output terminal #Q becomes an inverted output of the output terminal Q as show in FIG. 12g. The comparison section control signal 23 of the comparison section controller 22 is determined in such a manner that as shown in FIG. 12(e), the section between the first rise to the second rise in the message frame is at H level, i.e., in such a manner that the section of the transmission start symbol SOF is at H level. As a result, the number of clocks for the section associated with the H level of the transmission start symbol SOF applied to the H-level counter 11a corresponds to the period during which the logic is true of the AND circuit 9 in FIG. 6 supplied with the clock 6, the comparison section control signal 23 representing the section of the transmission start symbol SOF and the signal at the output terminal Q of the SR flip-flop 7 representing the H-level section of the data 5 to be demodulated. As a result, as shown in FIG. 12(h), the clock 6 is produced from the AND circuit 9 as the H-level section clock 9a only for the H-level section where the transmission start symbol SOF is at H level. In other words, the number of clocks produced from the AND circuit 9 can be detected as a time width of the H-level section of the transmission start symbol SOF.

Also for the L-level section of the transmission start symbol SOF, the time width of the L-level section can be detected on a similar operation with a configuration similar to that for clock detection for the H-level section described above. The number of clocks for the L-level section of the transmission start symbol SOF applied to the L-level counter 11b corresponds to the period during which the logic is true of the AND circuit 10 in FIG. 6 supplied with the clock 6, a comparison section control signal 23 representing the section of the transmission start symbol SOF and a signal at the output terminal #Q of the SR flip-flop 7 representing the L-level section of the data 5 to be demodulated. As shown in FIG. 12(*i*), the L-level section clock 10a is produced from the AND circuit 10, and the clock 6 is produced from the AND circuit 10 only for the section during which the transmission start symbol SOF is at L level. The time width of the L-level section of the transmission start symbol SOF can be detected by counting the number of clocks produced from the AND circuit 10.

The configuration and the operating principle of the H-level sampling clock adjusting unit 24a and the L-level sampling clock adjusting unit 24a shown in FIG. 10 are similar. Therefore, explanation below will be made only about the operation of the H-level sampling clock adjusting unit 24a shown in FIG. 11.

When the H-level section clock 9a produced only for the H-level section of the transmission start symbol SOF is applied to the H-level counter 11a, the H-level counter 11a counts the clock, which count is applied through the inverters 321, 322, ..., 326 to the full-adders 300, 301, ..., 305 of the H-level width comparator 12a. Then, the count value resulting from the operation of the H-level counter 11a provides the time width of the H-level section of the transmission start symbol SOF. The register RES has stored therein a reference value of the time width for 32<D>"0, 1, 0, 0, 0, 0 <B>" as described above, for example, in the case where the SAE.J1850 standard is applied. <D> designates a decimal number, and <B> a binary number. The data on the register RES is applied to the 6-bit full-adders 300, 301, 302, 303, 304, 305 of the H-level width comparator 12a.

As a result, the full-adders 300, 301, 302, 303, 304, 305 add the complement of the H-level counter 11a to the reference value on the register RES, and the carry signal at the carry-out terminal CO of the most-significant full-adder 305 is applied to the carry-in terminal C of the least-significant full-adder 300. Signals S00, S10, S20, S30, S40, S50 produced by applying each output SO of the full-adders 300, 301, ..., 305 through the inverters 327, 328, 329, 330, 331, 332 are applied to the selector controller 13a. In other words, the 6-bit full-adders 300, 301, 302, 303, 304, 305 of the H-level width comparator 12a are operated to subtract the count value for the H-level section of the transmission start symbol SOF of the H-level counter 11a from the reference value on the register RES, and apply the result of subtraction to the selector controller 13a. In the case where the difference is positive, the carry-out terminal CO of the most-significant full-adder 305 of the H-level counter 11a becomes H, while when the difference is negative, it assumes L level. In this way, difference signals S00, S10, S20, S30, S40, S50 and the carry-out signal C50 of the most-significant full-adder 305 after subtraction are applied to the selector controller 13a.

Figure 13:
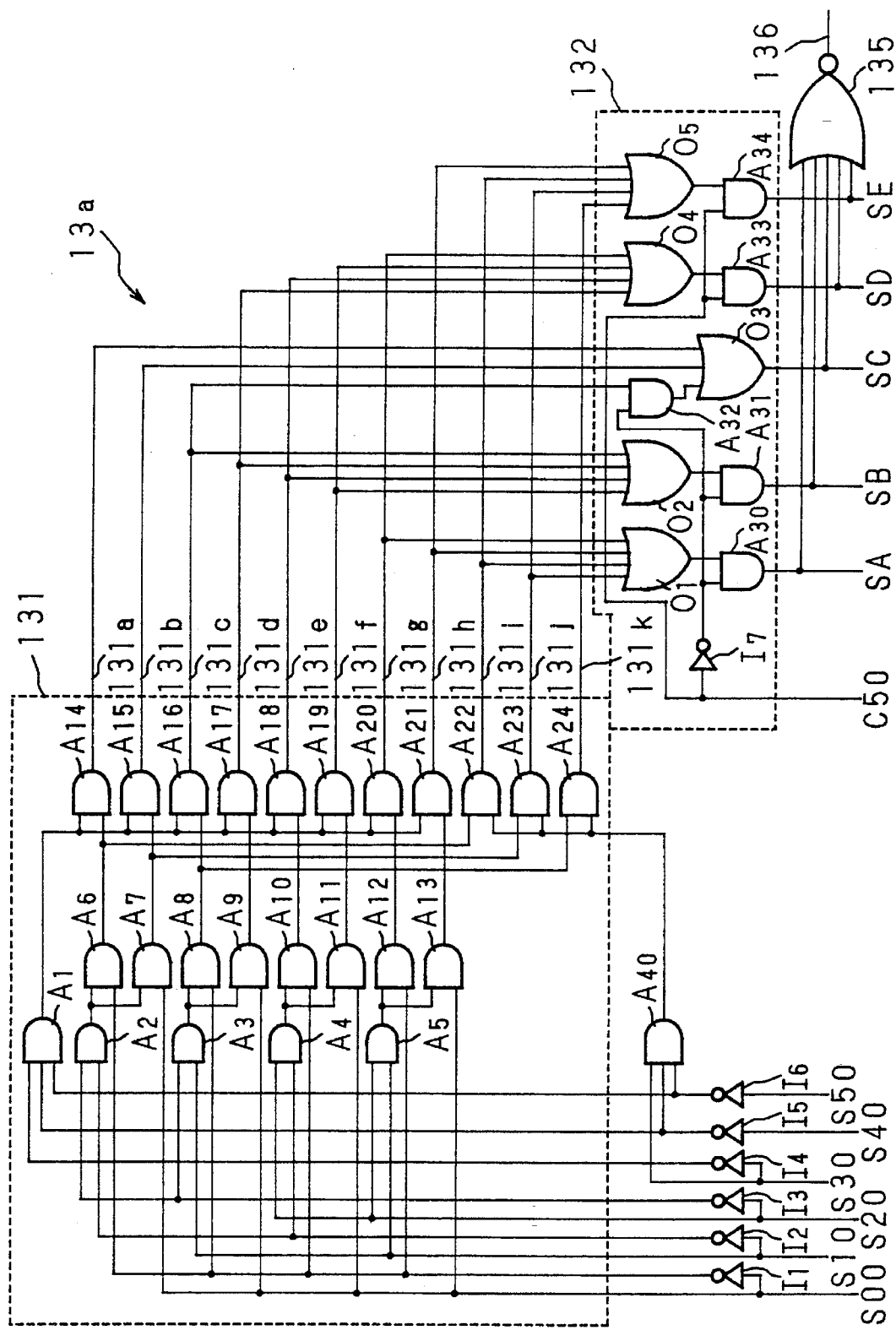
FIG. 13 is a block diagram showing a configuration of H-level side of a selector controller in FIG. 6.

FIG. 13 is a block diagram showing a configuration of the selector controller 13a. The selector controller 13a includes a decoder set 131 having AND circuits A1, A2, ..., A24, and a selector set 132 having OR gates 01, 02, 03, 04, 05 and AND circuits A30, A31, A32, A33, A34. The difference signal S00 is applied to an input terminal of the AND circuits A7, A9, A11, A13 on the one hand and through an inverter I1 to an input terminal of the AND circuits A6, A8, A10, A12 on the other hand. The difference signal S10 is applied to an input terminal of the AND circuits A3, A5 on the one hand and through an inverter I2 to an input terminal of the AND circuits A2, A4 at the same time. The difference signal S20 is applied to the other input terminal of the AND circuits A4, A5 on the one hand and through an inverter I3 to the other input terminal of the AND circuits A2, A3 on the other. The difference signal S30 is applied to the first input terminal of the three-input AND circuit A40 on the one hand and through an inverter I4 to the first inupt terminal of the three-input AND circuit A1 at the same time. The difference signal S40 is applied through an inverter I5 to the second input terminal of the three-input AND circuit A1. The difference signal S50 is applied through an inverter I6 to the third input terminal of the three-input AND circuits A1, A40.

The output signal of the AND circuit A2 is applied to the other input terminal of the AND circuits A6, A7, the output, signal of the AND circuit A3 to the other input terminal of the AND circuits AS, A9, the output signal of the AND circuit A4 to the other input terminal of the AND circuits A10, A11, and the output signal of the AND circuit A5 to the other input terminal of the AND circuits A12, A13. The output signal of the AND circuit A6 is applied to an input terminal of the AND Circuits A14, A22, the output signal of the AND circuit A7 to an input terminal of the AND circuits A15, A23, and the output signal of the AND circuit A8 to an input terminal of the AND circuits A16, A24. The output signal of the AND circuits A9, A10, A111, A12, A13 is applied to an input terminal of the AND circuits A17, A18, A19, A20, A21 separately from each other. The output signal of the three-input AND circuit A1 is applied to the other input terminal of the AND circuits A14, A15, A16, ..., A21 respectively. The output signal of the three-input AND circuit A40 is applied to tile other input terminal of the AND circuits A22, A23, A24 respectively.

An output signal 131a of the AND circuit A14 is applied to the first input terminal of the three-input OR circuit O3. An output signal 131b of the AND circuit A15 is applied to the second input terminal of the three-input OR circuit O3. An output signal 131c of the AND circuit A16 is applied to an input terminal of the AND circuit A32 and to the first input terminal of the four-input OR circuit O2 at the same time. An output signal 131d of the AND circuit A17 is applied to the first input terminal of the four-input OR circuit O4 and to the second input terminal of the four-input OR circuit O2 at the same time. An output signal 131e of the AND circuit A18 is applied to the second input terminal of the four-input OR circuit O4 on the one hand and to the third input terminal of the four-input OR circuit O2 on the other. An output signal 131f of the AND circuit A19 is applied to the third input terminal of the OR circuit O4 and to the fourth input terminal of the four-input OR circuit O2. An output signal of the AND circuit A20 is applied to the fourth input terminal of the four-input OR circuit O4 and to the first input terminal of the four-input OR circuit O1. An output signal 131h of the AND circuit A21 is applied to the first input terminal of the four-input OR circuit O5 and also to the second input terminal of the four-input OR circuit O1 at the same time. An output signal 131i of the AND circuit A22 is applied to the second input terminal of the four-input OR circuit O5 and also to the third input terminal of the four-input OR circuit O1 at the same time. An output signal 131*j* of the AND circuit A23 is applied to the third input terminal of the four-input OR circuit O5 on the one hand and to the fourth input terminal of the four-input OR circuit O1 on the other. An output signal 131*k* of the AND circuit A24 is applied to the fourth input terminal of the four-input OR circuit O5.

The output signal of the four-input OR circuit, O5 is applied to an input terminal of the AND circuit A34, and the output signal of the four-input OR circuit O4 is supplied to an input terminal of the AND circuit A33. The other input terminal of the AND circuits A33, A34 is supplied with the carry output signal C50, and the output signal of the AND circuit A32 is applied to the third input terminal of the three-input OR circuit O3. The output signal of the four-input OR circuit O2 is applied to an input terminal of the AND circuit. A31, and the output signal of the four-input OR circuit O1 to an input terminal of the AND circuit A30. The carry output signal C50 is applied through the inverter 17 to the other input terminal of the AND circuits A30, A31, A32. The selection signals SA, SB, SC, SD, SE produced from the AND circuits A30, A31, the four-input OR circuit O3 and the AND circuits A33, A34 is applied to a five-input NOR gate 135. An error output 136 is produced from the five-input NOR gate 135.

Now, the operation of the selector controller 13*a* will be explained. The output valise of the output signals 131*a*, 131*b*, . . . ,131*k* of the decoder set 131 is determined by the difference signals S00, S10, S20, S30, S40, S50 respectively. An H-level signal is produced when the result of subtraction is such that the output signal 131*a*="000000", the output signal 131*b*="000001", the output signal 131*c*="000010", the output signal 131*d*="000011", the output signal 131*e*= "000100", the output signal 131*f*="000101", the output signal 131*g*="000110", the output signal 131*h*="000111", the output signal 131*i*="001000", the output signal 131*j*= "001001" and the output signal 131*k*="001010" (all the numerals <B>). The decoder output is selected by the selector set 132, and the resulting selection signal SA assumes an H level when S00 to S50 are "–001001"<B> to "–000110"<B> (–9 to –6 <D>), the selection signs SB assumes an H level for "–000101"<B> to "–000010" <B> (–5 to –2 <D>), the selection signal SC assumes an H level for "–000001"<B> to "000010"<B> (–2 to 2<D>), the selection signal SD assumes an H level for "000011"<B> to "000110"<B> (3 to 6<D>), and the selection signal SE assumes an H level for "000111"<B> to "001010"<B> (7 to 10<D>).

The selection signals SA, SB, . . . ,SE that have selected the result of subtraction in this way is applied to the sampling selector 133 in FIG. 11, and selecting one of the 6-base, 7-base, octal, 9-base and decimal sampling counters, is produced as a sampling clock 134*a* for the H-level section. The sampling clock counter 28 counts the sampling clock output 134*a* from the rise point, and produces a three-count clock 29 for counting and producing three clocks, a six-count clock 30 for counting and producing six clocks, and a nine-count clock 31 for counting and producing nine clocks.

In the case where the selection signals SA, SB, SC, SD, SE applied to the OR gate 135 in FIG. 13 are not at H level, an error output 136 is produced. Explanation will be made with reference to FIG. 10. The H-level sampling clock 134*a* selected at the H-level sampling clock adjusting unit 24*a* and the L-level sampling clock 134*b* selected at the L-level sampling clock adjusting unit 24*b* are applied to the sampling clock selector 14, so that the H-level section clock 9*a* becomes H level. In the case other than during comparison without any comparison section control signal 23 being inputted, the H-level sampling clock 134*a* is produced as a sampling clock 25 from the sampling clock selector 14.

In the case where the comparison section control signal 23 is in the process of comparison, on the other hand, the count output 18 of the octal counter 2*c* is produced as a sampling clock 25. Also, the error signal 27 from the H-level sampling clock adjusting unit 24*a* and the L-level sampling clock adjusting unit 24*b* is produced through the OR gate 205.

Figure 14:
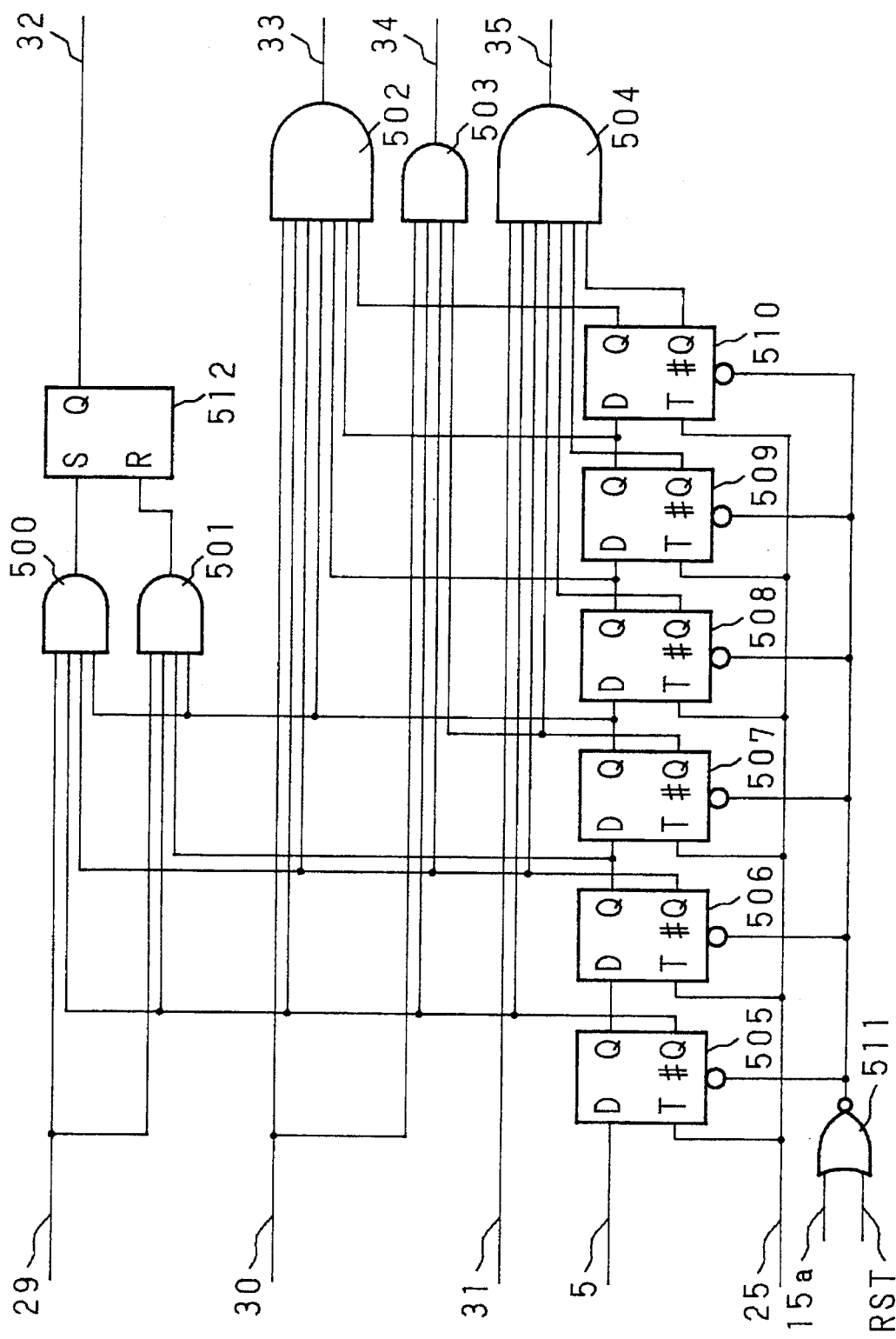
FIG. 14 is a block diagram showing a configuration of the demodulation unit in FIG. 6.

FIG. 14 is a block diagram showing a configuration of the demodulation unit 4. The three-count clock 29 produced from the sampling clock selector 14 (See FIG. 6) is applied to the first input terminal of the four-input AND circuits 500, 501. The six-count clock 30 is applied to the first input terminal of a seven-input AND circuit 502 and the first input terminal of a four-input AND circuit 503. The nine-count clock 31 is applied to the first input terminal of a seven-input AND circuit 504 the data 5 to be demodulated is applied to an input, terminal D of a D flip-flop 505 in the first stage. The sampling clock 25 is applied to a clock terminal T of D flip-flops 505, 506, 507, 508, 509, 510 in each of the first, second, third, fourth, fifth and sixth stages respectively.

The falling edge detection signal 15*a* is applied to an input terminal of the NOR gate 511, and a reset signal RST to the other input terminal. The output, signal is applied to the reset terminal of the D flip-flops 505, 506, 507, 508, 509, 510 respectively. The output signal at an output terminal Q of the D flip-flop 505 is applied to the input terminal D of the flip-flop 506. The output signal at an output terminal #Q is applied to the second input terminal of the four-input AND circuits 500, 501, the seven-input AND circuit 502, the four-input AND circuit 503 and the seven-input AND circuit 504. The output signal at an output terminal Q of the D flip-flop 506 is applied to an input terminal D of the D flip-flop 507 and the third input terminal of the four-input AND circuit 501, and the output signal #Q to the third input terminal of the four-input AND circuit 500, the seven-input AND circuit 502, the four-input AND circuit 503 and the seven-input AND circuit 504 respectively. The output signal at an output terminal Q of the D flip-flop 507 is applied to an input terminal D of the D flip-flop 508 and the fourth input terminal of the four-input AND circuits 500, 501 and the seven-input AND circuit 502 respectively, and the output signal at an output terminal #Q to the fourth input terminal of the seven-input AND circuit 504 and the four-input AND circuit 503.

The output signal at an output terminal Q of the D flip-flop 508 is applied to an input terminal D of the D flip-flop 509 and the fifth input terminal of the seven-input AND circuit 502. The output signal at an output terminal #Q of the D flip-flop 508 is applied to the fifth input terminal of the seven-input AND circuit 504. The output signal at an output terminal Q of the D flip-flop 509 is applied to an input terminal D of the D flip-flop 510 and the sixth input terminal of the seven-input AND circuit 502. The output signal at the output terminal #Q is applied to the sixth input terminal of the seven-input AND circuit 504. An output signal at the output terminal Q of the D flip-flop 510 is applied to the seventh input terminal of the seven-input AND circuit 502, and the output signal at an output terminal #Q to the seventh input terminal of the seven-input AND circuit 504.

The output signal at the four-input AND circuit 500 is applied to a set terminal S of an SR flip-flop 512. The output signal at the four-input AND circuit 501 is applied to a reset terminal R, and the data 32 demodulated from the PWM data is produced from an output terminal Q of the SR flip-flop 512. The symbol 33 demodulated from the PWM symbol is produced from the seven-input AND circuit 502, and the symbol 34 demodulated from the PWM symbol is outputted from the four-input AND circuit 503. The symbol 35 demodulated from the PWM symbol is produced from the seven-input AND circuit 504.

Now, the operation of the demodulation unit 4 is explained with reference to FIGS. 12(*a*) to 12(*r*). When the sampling clock 5 shown in FIG. 12(*l*) is applied to the 6-bit shift register including D flip-flops 505, 506, . . . ,510, the shifting operation is performed while sampling the data 5 to be demodulated shown in FIG. 12(*a*). The D flip-flops 505, 506, . . . , 510 are reset at each falling time point of the data 5 to be demodulated by the output signal of the NOR gate 511 supplied with the rising edge detection signal 15*a* and an external reset signal RST. Also, the output signal of the four-input AND circuit 500, which is supplied with the output signals at the output terminal #Q of the first-stage D flip-flop 505, the output terminal #Q of the second-stage D flip-flop 506 and the output terminal Q of the third-stage D flip-flop 507 and the three-count clock 29, is applied to the set terminal S of the SR flip-flop 512. The output signal of the four-input AND circuit 501, which is supplied with the output signals at the output terminal #Q of the first-stage D flip-flop 505, the output terminal Q of the second-stage D flip-flop 506 and the output terminal Q of the third-stage D flip-flop 507 and the three-count clock 29, is applied to the reset terminal R of the SR flip-flop 512, thereby producing the demodulated data 32 at the output terminal Q of the SR flip-flop 512.

Now, assume that the data 5 to be demodulated shown in FIG. 12(*a*) is applied. The rising edge detection signal 15*a* shown in FIG. 12(*b*) is produced at the rising edge of the transmission start symbol SOF shown in FIG. 12*a*, and the D flip-flops 505, 506, . . . ,510 providing a 6-bit shift register are set, and -the sampling operation is started by the next sampling clock 25 shown in FIG. 12(*l*), thereby starting the shift operation.

At the time point when the sampling clock 25 is applied in the number of three, the 6-bit shift register assumes the value "001000" in the first to sixth stages thereof. Assuming that three-count clock 29 in FIG. 12(*m*) is applied at this time, the output signal of the four-input AND circuit 500 rises to H level, which is applied to the set terminal S of the SR flip-flop 512, thereby raising the output terminal Q of the SR flip-flop 512 to H level. The bit 1 of the PWM data 5 to be demodulated is demodulated to produce a demodulation data "1" as shown in FIG. 12(*o*). Then, the rising edge of the bit 0 causes the flip-flops 505, 506, . . . ,510 to be reset again, and after sampling with the next, sampling clock 25, the shift operation is started. When the sampling clock 25 is applied in the number of three, the flip-flops 505, 506, . . . ,510 assume the value "011000" in the first to sixth stages thereof. At this time point, the three-count clock 29 shown in FIG. 12(*m*) is applied, with the result that as shown in FIG. 12(*r*), the output signal of the AND circuit 501 rises and is applied to the reset terminal R of the SR flip-flop 512. The SR flip-flop 512 is reset, and the output terminal Q thereof falls to L level, so that the bit 0 of the PWM data 5 to be demodulated is demodulated, and the demodulated data "0" is produced as shown in FIG. 12(*o*).

Next, the demodulation of the transmission start symbol SOF providing a demodulation symbol will be explained with reference to FIG. 12. Upon application of the PWM symbol providing the transmission start symbol SOF shown in FIG. 12(*a*), the rising edge detection signal 15*a* as shown in FIG. 12(*b*) is produced. The D flip-flops 505, 506, . . . ,510 are reset, and after sampling the next sampling clock 29, the shift operation is started. When the sampling clock 29 is applied in the number of six, the D flip-Flops 505, 506, . . . ,510 assume "001111" in the first to sixth stages thereof. At this time, the six-count clock 30 shown in FIG. 12(*n*) is applied, and the output signal of the four-input AND circuit 502 is produced as a demodulation data of the transmission start symbol SOF as shown in FIG. 12(*p*).

Also, the demodulation data for the transmission end symbol EOD and the one-message frame end symbol EOF are obtained by similar operation.

Figure 1:
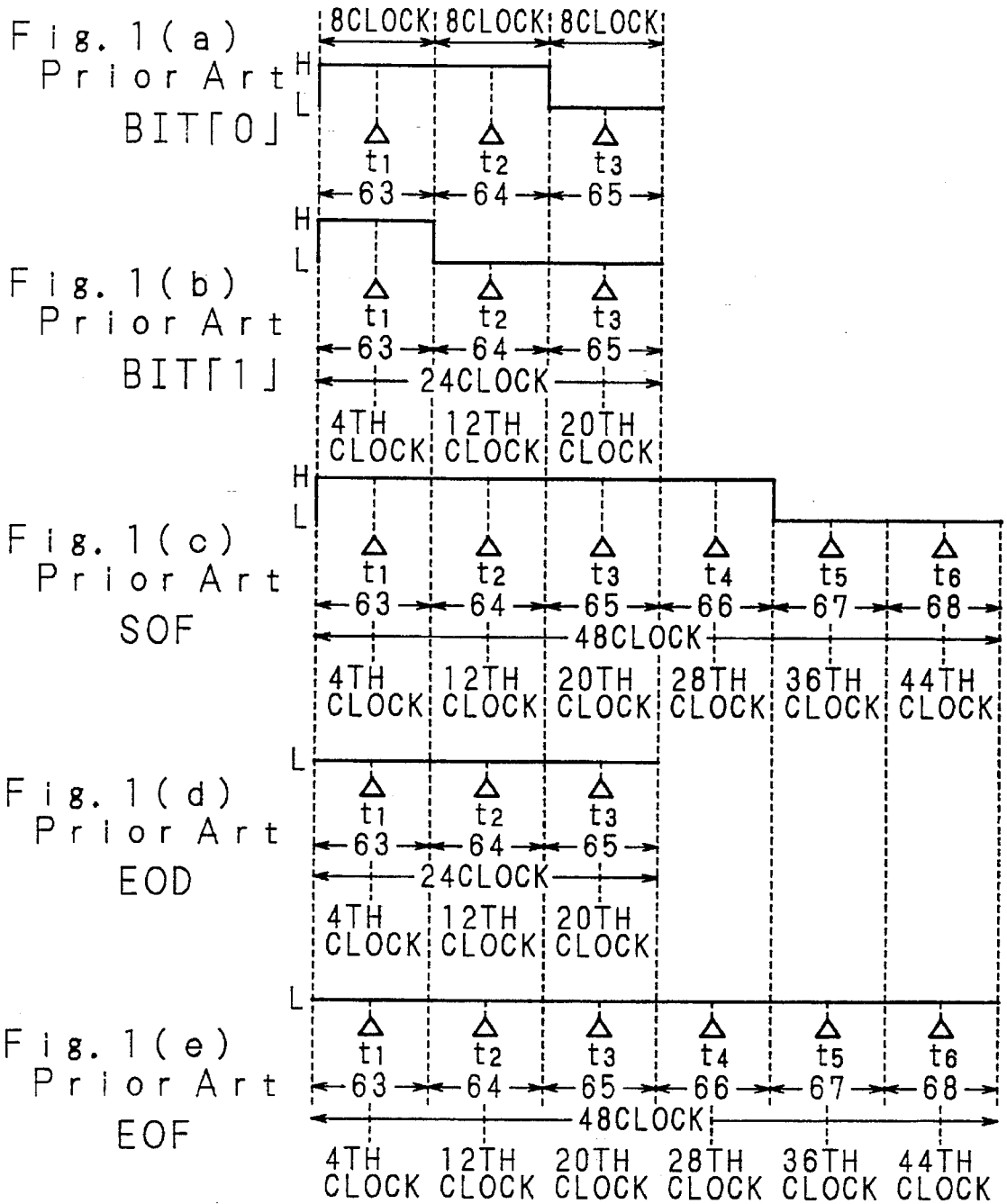
FIGS. 1(a) to 1(e) show patterns of the symbol and data subjected to pulse width modulation.
Figure 2:
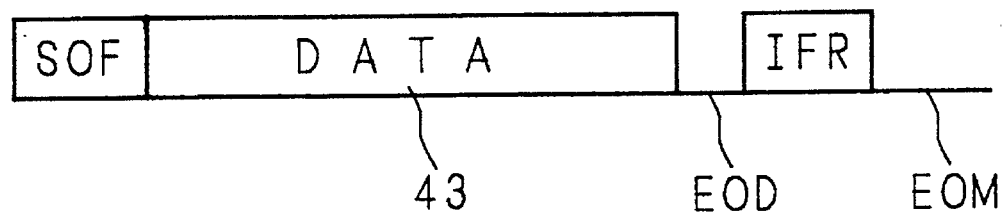
FIG. 2 is a diagram showing a Format of the message frame of SAE.J1850.
Figure 3:
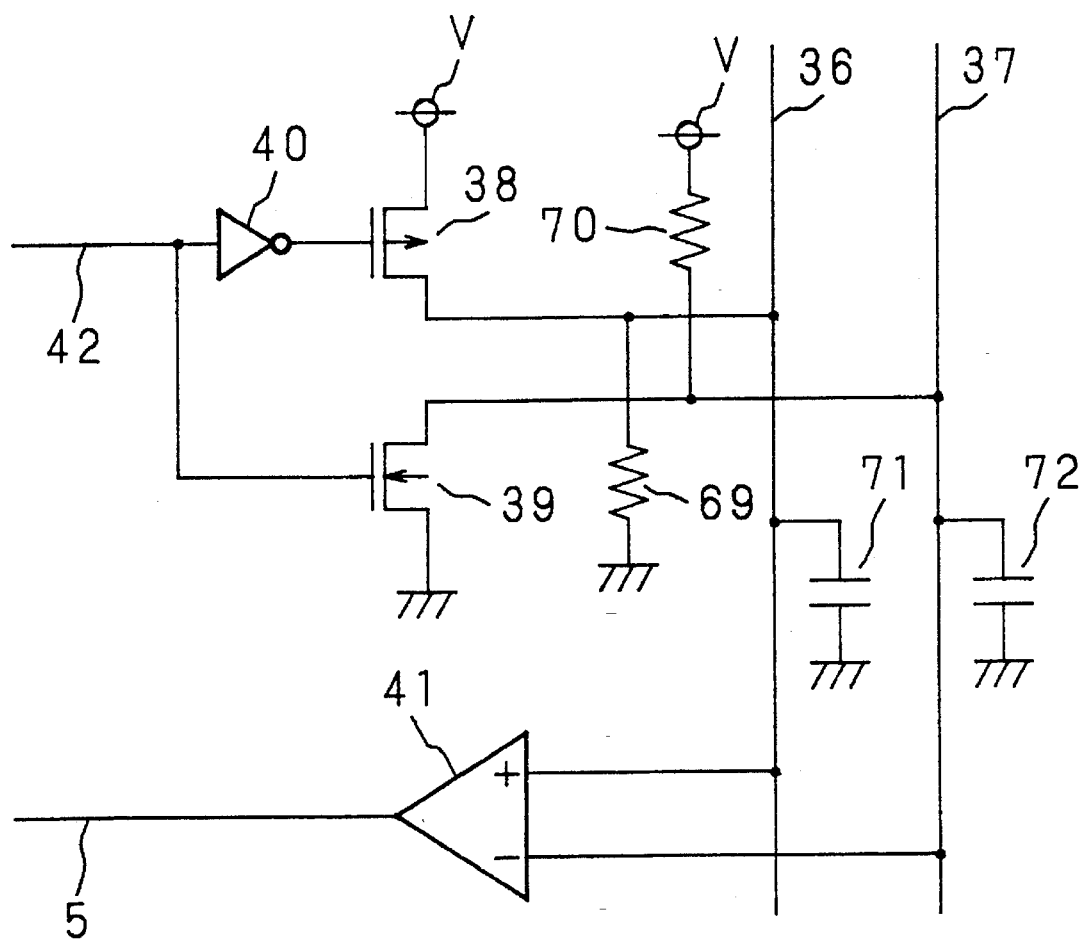
FIG. 3 is a block diagram showing a configuration of the receiver and the driver for the transfer data.
Figure 4:
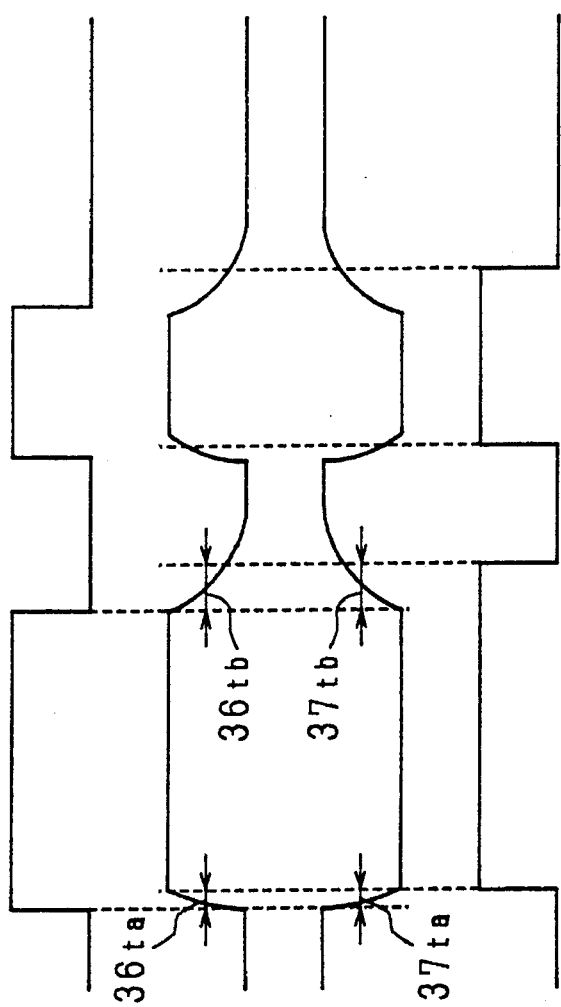
FIGS. 4(a) to 4(d) are timing charts for the transfer data received by the receiver.
Figure 5:
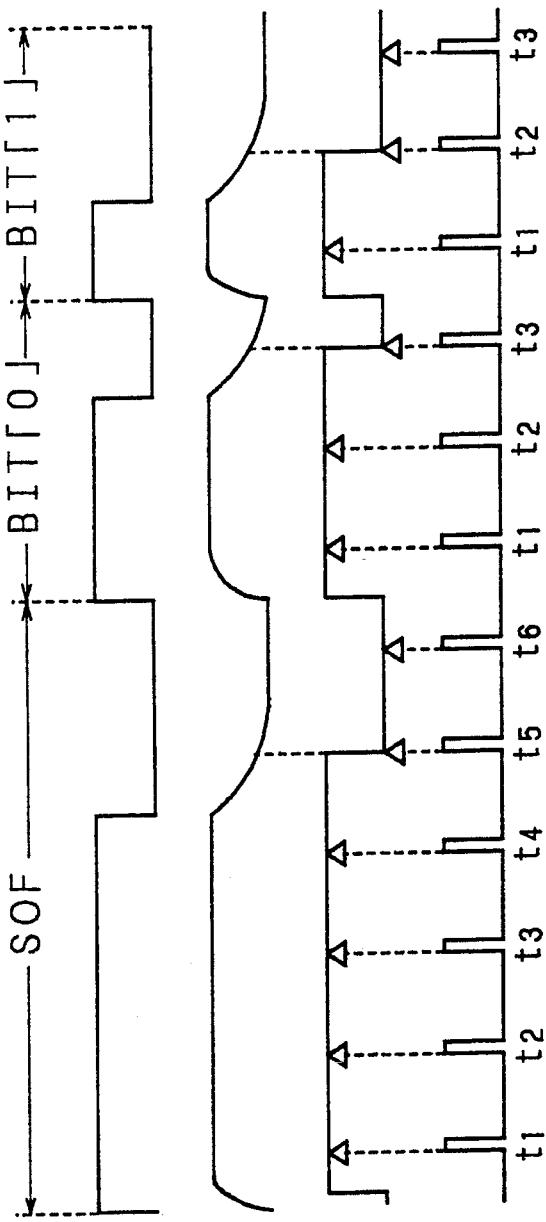
FIGS. 5(a) to 5(d) are timing charts for signals at various parts indicating the conventional sampling of the transfer data.

Further, explanation will be made with reference to the timing charts for signals at various parts shown in FIGS. 15(*a*) to 15(*h*). When the PWM symbol and the PWM data to be sent out as shown in FIG. 15(*a*) are applied from the driver of FIG. 3 to Bus$^+$36, Bus$^-$37, the potential at Bus$^+$and Bus$^-$undergoes a change as shown in FIG. 15(*b*) under the influence of the stray capacitances 71, 72, the pull-down resist, or 69 and the pull-up resistor 70. The output of the receiver 41, i.e., the data 5 to be demodulated that has been received is applied to the demodulator as a PWM symbol and PWM data at the timing shown in FIG. 15(*c*).

Assume, for example, that the output signal 134*a* at the H-level sampling clock adjusting unit, 24*a* shown in FIG. 10 selects the sampling counter 2*d* shown in FIG. 6 in accordance with the result of comparison for the H-level section, and that the output signal 134*b* of the L-level sampling clock adjusting unit 24*b* shown in FIG. 10 selects the sampling counter 2*b* shown in FIG. 6 in accordance with the result of comparison for the L-level section, thereby producing the count output 17 of the septal counter 2*b* at the timing shown in FIG. 9(*f*). Then, the timing shown in FIGS. 15(*e*) and 15(*f*) are involved.

The sampling clock 25 shown in FIG. 15(*g*) becomes the count output 19 of the 9-base counter 2*d* as shown in FIG. 15(*e*) for the H-level section having the PWM data of bit 0, and the count output 17 of the 7-base counter 2*b* shown in FIG. 15(*f*) for the L-level section. The period of the sampling clock 25 is thus regulated as shown in FIG. 15(*g*) by the H and L levels. In similar fashion, the count output 19 of the 9-base counter 2*d* as shown in FIG. 15(*e*) is produced for the H-level section having the PWM data of bit 1, and the count output 17 of the 7-base counter 2*b* as shown in FIG. 15(*f*) for the L-level section having the PWM data of bit 1. The PWM data is thus sampled at the sampling time as shown in FIG. 15(*g*), thereby producing the "1" demodulation data 32 as shown in FIG. 15(*h*). In this way, the period for sampling the data 5 to be demodulated is regulated in accordance with the result of comparison between the reference time width of the H level of the transmission start symbol SOF and the time width of H-level measurement. Thus, even when the potential change in the data to be demodulated is dulled, the demodulation data can be determined.

According to the embodiment under consideration, a plurality of sampling counters 2*a*, 2*b*, 2*c*, 2*d*, 2*e* are selected to regulate the period of the sampling clock 25. A similar effect is obtained by using an ordinary variable-length counter for producing binary to n-base counter and by switching the control of the counter by the control signal of a selector controller.

Also, according to the embodiment, the comparison section control signal 23 of the comparison section controller 22 is set in the transmission start symbol SOF for section comparison. Instead, the comparison section may be set to an appropriate position of the PWM symbol or the PWM data. In such a case, a similar effect is obtained simply by changing the reference value of the register in the sampling clock counter 28 in FIG. 11 and the decoder set 131 and the selector set 132 in FIG. 13.

Further, unlike in the embodiment under consideration in which a reference value is compared for the section of the transmission start symbol SOF in one message frame, a specific PWM symbol for determining the demodulation sample may be determined with similar effect by a communication system separately from the message frame and the sampling timing may be regulated for demodulation with the particular PWM symbol as a reference.

According to the embodiment described above, as shown in FIG. 13, the object of decoding having the result of subtraction only in the range of −10 to 10 clocks is decoded, and in the case where the result is different, an error output 136 is produced. The object of decoding, however, may be determined appropriately within a range allowable by the particular communication system. Also, the range selectable by the selector set 132 may be determined appropriately in similar fashion with equal effect.

It will thus be understood from the foregoing description that according to the invention, the data to be demodulated including a PWM symbol and PWM data is configured in such a manner that the period of the sampling timing for demodulation is regulated and different sampling timings are assigned to the H-level and L-level sections. Therefore, even for the data to be demodulated in which the level change is dulled under the influence of the stray capacitance, the pull-down resistor and the pull-up resistor of the dual wire bus line, the demodulation data can be determined, thereby producing very reliable demodulation data.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof ar therefore intended to be embraced by the claims.

What is claimed is:

1. A demodulation circuit of the communication control system for sampling and demodulating an object data including a significant symbol and a one-bit data which are represented by the first-level section and the second-level section of a predetermined time width, comprising:

means for detecting the leading edge and the trailing edge of selected one of the symbol and the one-bit data;

means for measuring the time width of selected one of the first-level section and the second-level section of selected one of the symbol and the one-bit data;

means for comparing the measured time width of selected one of the first-level section and the second-level section with a predetermined reference Lime width of selected one of the first-level section anti the second-level section;

sampling timing adjusting means for adjusting the sampling timing of the object data in accordance with the result of comparison; and demodulating means for demodulating by sampling the object data at the sampling timing adjusted by said sampling timing adjusting means.

2. A demodulation circuit of a communication control system for sampling and demodulating an object data including a significant symbol and a one-bit data which are represented by the first-level section and the second-level section of a predetermined time width, comprising:

means for detecting the leading edge and the trailing edge of selected one of the symbol and the one-bit data;

means for measuring the time width of selected one of the first-level section and the second-level section of selected one of the symbol and the one-bit data;

means for comparing the measured time width of selected one of the first-level section and the second-level section with a predetermined reference time width of selected one of the first-level section and the second-level section;

sampling timing adjusting means for adjusting the sampling timing of the object data in accordance with the result of comparison;

demodulating means for demodulating by sampling the object data at the sampling timing adjusted by said sampling timing adjusting means, wherein said sampling timing adjusting means includes:
   means for storing a reference value having the number of clocks for the first-level section;
   means for counting the clocks for the first-level section;
   means for subtracting the clock count value from the reference value; and
   means for controlling the count value for determining the sampling timing to a predetermined value on the basis of the result of subtraction.

3. A demodulation circuit of the communication control system, for sampling and demodulating an object data including a significant symbol and a one-bit data which are represented by the first-level section and the second-level section of a predetermined time width, comprising:

means for detecting the leading edge and the trailing edge of selected one of the symbol and the one-bit data;

means for measuring the time width of selected one of the first-level section and the second-level section of selected one of the symbol and the one-bit data;

means for comparing the measured time width of selected one of the first-level section and the second-level section with a predetermined reference time width of selected one of the first-level section and the second-level section;

sampling timing adjusting means for adjusting the sampling timing of the object data in accordance with the result of comparison;.

demodulating means for demodulating by .sampling the object data at the sampling timing adjusted by said sampling timing adjusting means, wherein said sampling timing adjusting means includes:
   means for storing a reference value of the number of clocks for the second-level section;
   means for counting the clocks for the second-level section;
   means for subtracting the clock count value from the reference value; and
   means for controlling the count value for determining the sampling timing to a predetermined value on the basis of the result of subtraction.

4. A demodulation circuit of the communication control system for sampling and demodulating an object data including a significant symbol and a one-bit data which are represented by the first-level section and the second-level section of a predetermined time width, comprising:

means for detecting the leading edge and the trailing edge of selected one of the symbol and the one-bit data;

means for measuring the time width of selected one of the first-level section and the second-level section of selected one of the symbol and the one-bit data;

means for comparing the measured time width of selected one of the first-level section and the second-level section with a predetermined reference time width of selected one of the first-level section and the second-level section;

sampling timing adjusting means for adjusting the sampling timing of the object data in accordance with the result of comparison;

demodulating means for demodulating by sampling the object data at the sampling timing adjusted by said sampling timing adjusting means, wherein said sampling timing adjusting means includes:
means for storing the reference value of the number of clocks adapted to be set for the first-level section and the second-level section adapted to be set appropriately;
means for subtracting the clock count value for the appropriately-set first-level section and the second-level section from the reference value for the first-level section and the second-level section respectively; and
means for controlling the count value for determining the sampling timing to a predetermined value on the basis of the result of subtraction.

5. A demodulation circuit of the communication control system for sampling and demodulating an object data including a significant symbol and a one-bit data which are represented by the first-level section and the second-level section of a predetermined time width, comprising:

means for detecting the leading edge and the trailing edge of selected one of the symbol and the one-bit data;

means for measuring the time width of selected one of the first-level section and the second-level section of selected one of the symbol and the one-bit data;

means for comparing the measured time width of selected one of the first-level section and the second-level section with a predetermined reference time width of selected one of the first-level section and the second-level section;

sampling timing adjusting means for adjusting the sampling timing of the object data in accordance with the result of comparison;

demodulating means for demodulating by sampling the object data at the sampling timing adjusted by said sampling timing adjusting means, wherein said demodulating means includes means for sampling the first-level section and the second-level section by a separate sampling timing on the basis of the sampling timing adjusted by said sampling timing adjusting means.

6. A demodulation circuit of the communication control system according to claim 4, wherein said demodulating means includes means for sampling by the sampling timing selected one of the one-bit data and the symbol following the first-level section and the second-level section appropriately set on the basis of the sampling timing adjusted by said sampling timing adjusting means.

7. A demodulation circuit of the communication control system, comprising:

means for detecting the leading edge and the trailing edge of selected one of a significant symbol and a one-bit data which are represented by the first-level section and the second-level section of a predetermined time width;

means for measuring the time width of selected one of the first-level section and the second-level section of selected one of the symbol and the one-bit data on the basis of the result of detection of the leading edge and the trailing edge;

means for comparing the measured time width of selected one of the first-level section and the second-level section with a predetermined time width of selected one of the first-level section and the second-level section;

sampling timing adjusting means for adjusting the sampling timing of selected one of the symbol and the one-bit data in accordance with the result of comparison; and means for demodulating by sampling an object data including selected one of the symbol and the one-bit data at the sampling timing adjusted by said sampling timing adjusting tion means.

8. A demodulation circuit of the communication control system for sampling and demodulating an object data including a significant symbol and a one-bit data which are represented by the first-level section and the second-level section of a predetermined time width, comprising:

time width measuring means for measuring the time width of selected one of the first-level section and the second-level section of selected one of the symbol and the one-bit data;

means for comparing the measured time width of selected one of the first-level section and the second-level section with a predetermined reference time width of selected one of the first-level section and the second-level section;

sampling timing adjusting means for adjusting the sampling timing of the object data in accordance with the result of comparison; and means for demodulating by sampling the object data at the sampling timing adjusted by said sampling timing adjusting tion means.

9. A demodulation circuit of the communication control system according to claim 8, wherein said time width measuring means includes:
means for detecting the rising edge and the falling edge of selected one of the symbol and the one-bit data; and
means for measuring the time width of selected one of the first-level section and the second-level section of selected one of the symbol and the one-bit data on the basis of the result of edge detection.

* * * * *